US012673871B2

(12) United States Patent
Hahl et al.

(10) Patent No.: US 12,673,871 B2
(45) Date of Patent: Jul. 7, 2026

(54) SUBSTRATE AND METHOD FOR ITS MANUFACTURING

(71) Applicant: Fraunhofer-Gesellschaft zur Förderung der angewandten Forschung e.V., Munich (DE)

(72) Inventors: Felix Hahl, Freiburg (DE); Jan Jeske, Freiburg (DE); Tingpeng Luo, Freiburg (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 860 days.

(21) Appl. No.: 17/929,507

(22) Filed: Sep. 2, 2022

(65) Prior Publication Data

US 2023/0061777 A1     Mar. 2, 2023

(30) Foreign Application Priority Data

Sep. 2, 2021    (DE) ......................... 102021209666.2

(51) Int. Cl.
| | |
|---|---|
| *C01B 32/28* | (2017.01) |
| *C30B 29/04* | (2006.01) |
| *C30B 33/02* | (2006.01) |
| *C30B 33/04* | (2006.01) |
| *C30B 33/10* | (2006.01) |
| *C30B 33/12* | (2006.01) |

(52) U.S. Cl.
CPC .............. *C01B 32/28* (2017.08); *C30B 29/04* (2013.01); *C30B 33/02* (2013.01); *C30B 33/04* (2013.01); *C30B 33/10* (2013.01); *C30B 33/12* (2013.01); *C01P 2002/54* (2013.01); *C01P 2006/42* (2013.01); *C01P 2006/60* (2013.01)

(58) Field of Classification Search
CPC ......... C01B 32/28; C30B 29/04; C30B 33/02; C30B 33/04; C30B 33/10; C30B 33/12; C01P 2002/54; C01P 2006/42; C01P 2006/60
USPC ...................................................... 423/265
See application file for complete search history.

(56) References Cited

U.S. PATENT DOCUMENTS 8,986,646 B2 *    3/2015  Twitchen ............... A44C 17/02
                                                        423/446
2010/0104494 A1    4/2010  Meng et al.

FOREIGN PATENT DOCUMENTS

EP          0 615 954 A1      9/1994
JP          2010254039 A     11/2010
                 (Continued)

OTHER PUBLICATIONS

Machine Translation of WO 2020239172 A1. (Year: 2020).*
                 (Continued)

*Primary Examiner* — Coris Fung
*Assistant Examiner* — Catriona M Corallo
(74) *Attorney, Agent, or Firm* — Hussey IP, LLC

(57) ABSTRACT

A substrate comprising diamond has NV$^-$ centers in a concentration greater than about 0.5 parts per million (ppm). The method for producing this diamond substrate includes providing diamond being doped with nitrogen, irradiating at least a partial surface of the substrate with radiation that creates vacancies in the diamond, and carrying out a second heat treatment of the substrate at a certain temperature. The substrate can be used as a sensor element of a magnetometer or also as a qubit of a quantum computer.

9 Claims, 6 Drawing Sheets

(56)            References Cited

FOREIGN PATENT DOCUMENTS

WO      WO 2009/045445 A1      4/2009
WO      WO-2020239172 A1   *   12/2020   .......... G01R 33/032

OTHER PUBLICATIONS

Office Action dated Apr. 29, 2022 for German Patent Application No. 10 2021 209 666.2 (9 pp.), note: pp. 1 and 2 are English language Explanations to Section C. Result of Determination Document.

Botsoa et al., "Optimal conditions for NV-center formation in type-1b diamond studied using photoluminescence and positron annihilation spectroscopies," Physical Review B 84, 125209, American Physical Society (2011) (6 pages).

Capelli et al., "Increased nitrogen-vacancy centre creation yield in diamond through electron beam irradiation at high temperature," Carbon 143 (2019) 714-719 (6 pp.).

Collins, Alan T., Optical Centres Produced in Diamond by Radiation Damage, *New Diamond and Frontier Carbon Technology*, vol. 17, No. 2 2007, MYU Tokyo (15 pp.).

Collins et al., "High-temperature annealing of optical centers in type-I diamond," J. Appl. Phys. 97, (0832005, 083517, ISSN 0021-8979 (11 pp.).

Edmonds et al., "Generation of nitrogen-vacancy ensembles in diamond for quantum sensors: Optimization and scalability of CVD processes," arXiv:2004.01746v1 [cond-mat.mtrl-sci], Apr. 3, 2020 (16 pp.).

Fraczek et al., "Laser Spectroscopy of NV- and NV0 colour centres in synthetic diamond," vol. 7, No. 7, Jul. 1, 2017, Optical Materials Express 2571, https://doi.org/10 1364/OME.7.002571 (15 pp).

Havlik et al., "Boosting nanodiamond fluorescence: towards development of brighter probes," Nanoscale, 2013, 5, 3208-3211 (5 pp.).

Jeske et al., "Laser threshold magnetometry," New J. Phys. 18 (2016) 013015 IOP Publishing (9 pp.).

Kazuchits et al., "Comparison of HPHT and LPHT Annealing of Ib Synthetic Diamond," https://doi.org/10.1016/j.carbon.2018.11.018 (9 pp.).

Lühmann et al., "Screening and engineering of colour centres in diamond," Journal of Applied D: Applied Physics, J. Phys. Appl. Phys. 51 483002 (25 pp.).

Rondin et al., "Magnetometry with nitrogen-vacancy defects in diamond," Rep. Prog, Phys. 77 (2014) 056503 (27 pp.).

Smith et al., "Colour centre generation in diamond for quantum technologies," Nanophotonics 2019; 8(11): 1889-1906; nanoph-2019-0196 (18 pp.).

Zhang et al., "Diamond Nitrogen-Vacancy Center Magnetometry—Advances and Challenges," arXiv preprint arXiv; 2010, 10231, 2020, ISSN 2331-8422, pp. 1-17 (18 pp.). [uploaded for filing in two sections due to size constraints].

* cited by examiner

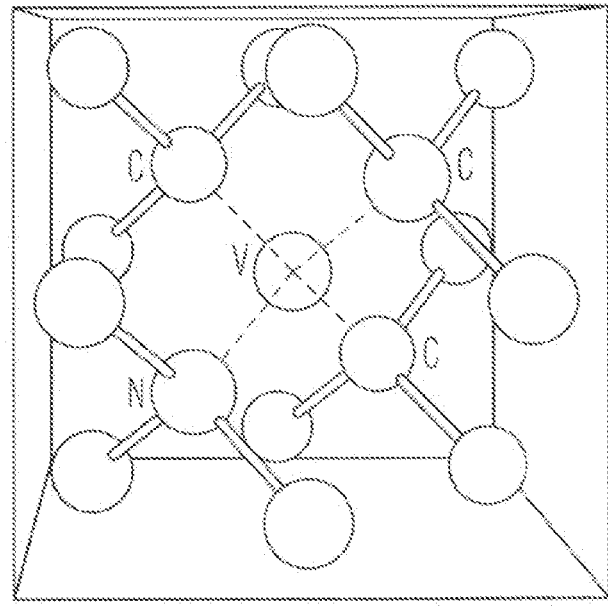
Fig. 1      (Prior Art)
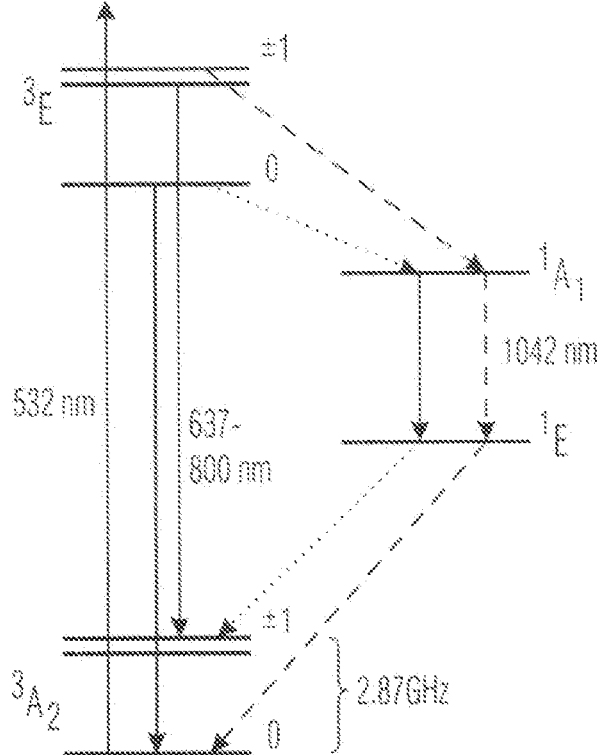
Fig. 2      (Prior art)

SUBSTRATE AND METHOD FOR ITS MANUFACTURING

CROSS-REFERENCE TO RELATED APPLICATIONS

This application claims priority under 35 USC § 119 to German Patent Application No. 10 2021 209 666.2, filed Sep. 2, 2021, which is hereby incorporated by reference.

FIELD OF THE INVENTION

The invention relates to a substrate of diamond that has $NV^-$ centers in a concentration greater than about 0.5 parts per million (ppm). The method for producing a substrate of this type includes providing diamond being doped with nitrogen, irradiating at least a partial surface of the substrate with radiation that creates vacancies in the diamond, and carrying out a second heat treatment of the substrate at a temperature of about 700° C. to about 1500° C. The substrate can be used as a sensor element of a magnetometer or also as a qubit of a quantum computer.

SUMMARY OF THE INVENTION

In one aspect, the invention relates to a substrate comprising diamond, the diamond comprising $NV^-$ color centers in a concentration of more than 0.5 ppm, wherein the diamond of the substrate has an absorption of electromagnetic radiation in a wavelength range from 680 nm to 760 nm of less than 0.4 cm−1.

According to another aspect of the invention, a method for producing a substrate is disclosed, said method comprising the following steps: providing a substrate comprising diamond, the diamond being doped with nitrogen; submitting the substrate to a first heat treatment at a temperature selected from 1500° C. to 2500° C. in an atmosphere comprising an oxygen partial pressure of less than 0.21 mPa; irradiating at least a partial area of the substrate with radiation that causes vacancies in the diamond; submitting the substrate to a second heat treatment at a temperature of 700° C. to 1500° C.

BRIEF DESCRIPTION OF THE DRAWINGS

The accompanying figures, where like reference numerals refer to identical or functionally similar elements throughout the separate views, which are not true to scale, and which, together with the detailed description below, are incorporated in and form part of the specification, serve to illustrate further various embodiments and to explain various principles and advantages all in accordance with the devices, apparatuses, and methods. Advantages of embodiments of the systems, apparatuses, and methods will be apparent from the following detailed description of the exemplary embodiments thereof, which description should be considered in conjunction with the accompanying drawings in which:

FIG. 1 illustrates a schematic diagram of an NV center.

FIG. 2 illustrates a term scheme of an NV– color center.

DETAILED DESCRIPTION

Figure 3:
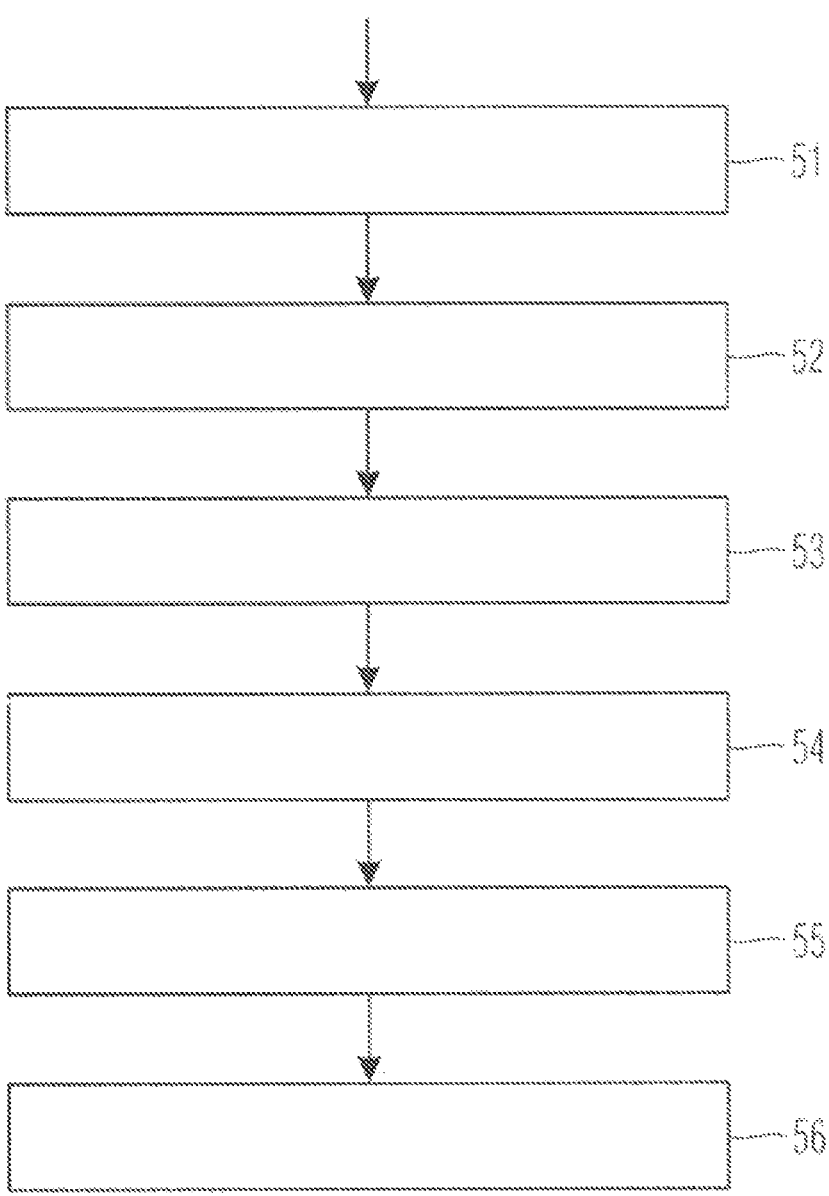
FIG. 3 illustrates a flow chart of the method according to an embodiment.

As required, detailed embodiments of the devices, products, apparatuses, and methods are disclosed herein; however, it is to be understood that the disclosed embodiments are merely exemplary of the devices, products, apparatuses, and methods which can be embodied in various forms. Therefore, specific structural and functional details disclosed herein are not to be interpreted as limiting, but merely as a basis for the claims and as a representative basis for teaching one skilled in the art to variously employ the devices, products, apparatuses, and methods in virtually any appropriately detailed structure. Further, the terms and phrases used herein are not intended to be limiting; but rather, to provide an understandable description of the devices, products, apparatuses, and methods. While the specification concludes with claims defining the features of the devices, products, apparatuses, and methods that are regarded as novel, it is believed that the devices, products, apparatuses, and methods will be better understood from a consideration of the following description in conjunction with the drawing figures, in which like reference numerals are carried forward.

In the following detailed description, reference is made to the accompanying drawings which form a part hereof, and in which are shown by way of illustration embodiments that may be practiced. It is to be understood that other embodiments may be utilized and structural or logical changes may be made without departing from the scope. Therefore, the following detailed description is not to be taken in a limiting sense, and the scope of embodiments is defined by the appended claims and their equivalents.

Alternate embodiments may be devised without departing from the spirit or the scope of the invention. Additionally, well-known elements of exemplary embodiments of the devices, products, apparatuses, and methods will not be described in detail or will be omitted so as not to obscure the relevant details of the systems, apparatuses, and methods.

Before the devices, products, apparatuses, and methods are disclosed and described, it is to be understood that the terminology used herein is for the purpose of describing particular embodiments only and is not intended to be limiting. The terms "comprises," "comprising," or any other variation thereof are intended to cover a non-exclusive inclusion, such that a process, method, article, or apparatus that comprises a list of elements does not include only those elements but may include other elements not expressly listed or inherent to such process, method, article, or apparatus. An element proceeded by "comprises a" does not, without more constraints, preclude the existence of additional identical elements in the process, method, article, or apparatus that comprises the element. The terms "including" and/or "having," as used herein, are defined as comprising (i.e., open language). The terms "a" or "an", as used herein, are defined as one or more than one. The term "plurality," as used herein, is defined as two or more than two. The term "another," as used herein, is defined as at least a second or more. The description may use the terms "embodiment" or "embodiments," which may each refer to one or more of the same or different embodiments.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact (e.g., directly coupled). However, "coupled" may also mean that two or more elements are not in direct contact with each other, but yet still cooperate or interact with each other (e.g., indirectly coupled).

For the purposes of the description, a phrase in the form "A/B" or in the form "A and/or B" or in the form "at least one of A and B" means (A), (B), or (A and B), where A and B are variables indicating a particular object or attribute. When used, this phrase is intended to and is hereby defined as a choice of A or B or both A and B, which is similar to the phrase "and/or". Where more than two variables are present in such a phrase, this phrase is hereby defined as including only one of the variables, any one of the variables, any combination of any of the variables, and all of the variables, for example, a phrase in the form "at least one of A, B, and C" means (A), (B), (C), (A and B), (A and C), (B and C), or (A, B and C).

Relational terms such as first and second, top and bottom, and the like may be used solely to distinguish one entity or action from another entity or action without necessarily requiring or implying any actual such relationship or order between such entities or actions. The description may use perspective-based descriptions such as up/down, back/front, top/bottom, and proximal/distal. Such descriptions are merely used to facilitate the discussion and are not intended to restrict the application of disclosed embodiments. Various operations may be described as multiple discrete operations in turn, in a manner that may be helpful in understanding embodiments; however, the order of description should not be construed to imply that these operations are order dependent.

As used herein, the term "about" or "approximately" applies to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure. As used herein, the terms "substantial" and "substantially" means, when comparing various parts to one another, that the parts being compared are equal to or are so close enough in dimension that one skill in the art would consider the same. Substantial and substantially, as used herein, are not limited to a single dimension and specifically include a range of values for those parts being compared. The range of values, both above and below (e.g., "+/−" or greater/lesser or larger/smaller), includes a variance that one skilled in the art would know to be a reasonable tolerance for the parts mentioned.

Herein various embodiments of the systems, apparatuses, and methods are described. In many of the different embodiments, features are similar. Therefore, to avoid redundancy, repetitive description of these similar features may not be made in some circumstances. It shall be understood, however, that description of a first-appearing feature applies to the later described similar feature and each respective description, therefore, is to be incorporated therein without such repetition.

According to one aspect of the invention, a substrate is disclosed which comprises or consists of diamond. In some embodiments of the invention, the substrate may be made from polycrystalline diamond. In other embodiments of the invention, the substrate can be made from monocrystalline diamond. The substrate may comprise natural or artificial diamond. In some embodiments of the invention, an artificial diamond can be produced by means of a high-pressure-high-temperature (HPHT) method. In other embodiments of the invention, artificial diamond can be deposited from an activated gas phase using a low pressure synthesis. A CVD diamond of this type can be produced homoepitaxially on a diamond substrate or heteroepitaxially on a foreign substrate, for example, molybdenum, silicon, strontium titanate or iridium.

The substrate used according to an embodiment additionally comprises, at least in individual partial areas or partial volumes, nitrogen which is at least partially incorporated on lattice sites of the diamond. During the production of the diamond, the nitrogen can be introduced thereinto by means of high-pressure or low-pressure synthesis or can be found naturally in the diamond. According to an embodiment, the nitrogen content is more than about 1 ppm or more than about 5 ppm or more than about 10 ppm or more than about 50 ppm. However, in some embodiments of the invention, the nitrogen content is less than about 300 ppm or less than about 200 ppm or less than about 100 ppm.

According to an embodiment, said substrate is initially subject to a first heat treatment at a temperature selected from about 1500° C. to about 2500° C. In some embodiments, the heat treatment can last for more than one hour or more than 5 hours or more than 10 hours. However, typically the heat treatment will last less than 48 hours. As a general rule, the higher the selected temperature, the shorter the duration of the heat treatment and vice versa. In order to avoid the destruction of the diamond, the first heat treatment is preferably carried out at an oxygen partial pressure of less than about 0.21 mPa. This can be done, for example, in a vacuum. In other embodiments of the invention, an inert gas atmosphere can be used, which in some embodiments of the invention can be atmospheric pressure. In other embodiments of the invention, the inert gas atmosphere can have a higher or lower pressure, for example between about 200 mbar and about 2 bar or between about 500 mbar and about 1500 mbar.

In some embodiments of the invention, the first heat treatment can alternatively or additionally be performed at a high pressure of about 0.5 GPa to about 10 GPa, such that the conditions during the first heat treatment are comparable to the conditions to which a diamond crystal is subjected during the HPHT synthesis.

In the next method step, at least a partial area of the substrate is irradiated with radiation that creates vacancies in the diamond. In some embodiments of the invention, the radiation used for this purpose can be a particle radiation, for example, an electron radiation and/or a proton radiation and/or a heavy ion radiation and/or a neutron radiation. The energy of the radiation can be selected from about 0.3 keV to about 10 MeV for electron radiation or from about 1 MeV to about 10 MeV for proton or heavy ion radiation. It is essential that the radiation creates vacancies in the crystal lattice of the diamond, i.e. removes individual carbon atoms from the crystal lattice from their lattice sites.

After carrying out the irradiation, a second heat treatment is proposed according to an embodiment, which is performed at lower temperatures than the first heat treatment. For example, the second heat treatment can be carried out at a temperature of about 700° C. to about 1500° C. The duration of the second heat treatment may last from about 0.5 hours to about 5 hours. The second heat treatment can also be carried out in a vacuum or in an inert gas atmosphere to avoid damage to the diamond or oxidation of its surface.

The substrate manufacturing method proposed according to an embodiment therefore differs from known methods primarily with regard to the first heat treatment which is carried out prior to the irradiation and the second heat treatment. According to an embodiment, it was discovered that the density of undesirable absorbing defects in the diamond crystal can be reduced by the above mentioned combination of all three method steps. As a result, the fluorescent light emanating from the color centers can be absorbed to a lesser extent. This can increase the sensitivity and/or accuracy of a color center-based magnetometer or the spin coherence time of a qubit. In some embodiments of the invention, the ensemble contrast in optically detected magnetic resonance can be enhanced, which can also increase sensitivity.

In some embodiments of the invention, the substrate in the diamond produced according to an embodiment can comprise $NV^-$ centers at a concentration of less than about 10.0 ppm, or of less than about 3.0 ppm, or of less than about 2.5 ppm, or of less than about 2.0 ppm. However, the concentration of the $NV^-$ centers can be greater than about 1 ppm or greater than about 1.5 ppm.

In some embodiments of the invention, the first heat treatment can be carried out at a temperature of about 1700° C. to about 1900° C. In this temperature range, A centers (N—N) are formed. Light absorbing centers, such as N defects and P1 defects, are reduced since the nitrogen becomes mobile in the crystal lattice at temperatures above 1700° C. At the same time, the risk of damage to the diamond is reduced at temperatures below about 1900° C.

In some embodiments of the invention, the absorption of electromagnetic radiation in the diamond of the substrate in the wavelength range from about 680 nm to about 760 nm can be less than about 0.2 cm−1 or less than about 0.1 cm−1 or less than about 0.05 cm−1 or less than about 0.01 cm−1. The absorption coefficient can be carried out by UV-VIS spectroscopy. The measurement can be performed using an integrating sphere to detect the transmitted light. Reflection from the surface of the substrate due to the difference in refractive indices is here taken into account.

In some embodiments of the invention, the absorption of electromagnetic radiation in the diamond can be greater than about 0.001 cm−1 in the wavelength range from about 680 nm to about 760 nm.

In some embodiments of the invention, the absorption of electromagnetic radiation in the diamond in the wavelength range from about 1000 nm to about 1100 nm can be less than about 0.04 cm−1 or less than about 0.02 cm−1 or less than about 0.01 cm−1.

The values mentioned for the absorption of electromagnetic radiation can be achieved if the first heat treatment lasts between about 5 hours to about 48 hours. In other embodiments of the invention, the heat treatment may last between about 5 hours and about 12 hours. In yet other embodiments of the invention, the heat treatment may last between about 24 hours and about 48 hours, or between about 1 hour and about 6 hours. In some embodiments of the invention, the first heat treatment can last between about 8 hours to about 16 hours. In some embodiments of the invention, the first heat treatment, particularly when carried out in vacuum, may last from about 1 minute to about 60 minutes, or from about 5 minutes to about 30 minutes, or from about 10 minutes to about 40 minutes.

In some embodiments of the invention, the second heat treatment can be carried out at a temperature of from about 800° C. to about 2000° C. In other embodiments of the invention, the second heat treatment can be performed at a temperature of about 600° to about 1000° C. In yet other embodiments of the invention, the second heat treatment can be carried out at a temperature of from about 800° to about 900°. These temperature ranges are suitable to mobilize the vacancies introduced by irradiation to the extent that they migrate to lattice sites adjacent to substituted nitrogen so as to form NV centers. At the same time, the temperatures are low enough to avoid damage to the diamond or movement of the nitrogen in the crystal lattice of the substrate.

In some embodiments of the invention, the method can further include polishing and/or wet or dry chemical etching of at least one surface of the substrate. The polishing and/or etching may be performed both after the first heat treatment and/or after the second heat treatment. This can remove graphitic phases or other damage to the crystal lattice, which in some embodiments of the invention increase the absorption and/or scattering of fluorescent light emanating from the color centers after the heat treatment. However, after polishing and/or etching, a substantially defect-free substrate can be obtained again.

In some embodiments of the invention, dry chemical etching of the substrate can be performed using a hydrogen plasma. In some embodiments of the invention, wet chemical etching of at least one surface of the substrate can be carried out by means of nitrating acid, i.e. a mixture of concentrated nitric acid and concentrated sulfuric acid at various mixing ratios. The mixing ratio can be adjusted between about 1:2 and about 2:1. Both etchants attack damaged material and graphitic phases at a greater etch rate than crystalline diamond, thus avoiding excessive removal of material from the substrate.

In some embodiments of the invention, the first heat treatment can be carried out in an inert gas atmosphere. Such an inert gas atmosphere can comprise or consist of H2 and/or N2 and/or Ar and/or Kr. The gases mentioned are inert or non-reactive to diamond, so that excessive damage to the substrate is avoided during the heat treatment, for example by oxidation by atmospheric oxygen or atmospheric water.

In some embodiments of the invention, the first heat treatment can be carried out in a vacuum. In some embodiments, the vacuum can be less than about 5·10−5 mbar or less than about 1·10−5 mbar or less than about 1·10−6 mbar. Like an inert gas atmosphere, heat treatment in a vacuum also results in preventing oxidizing gases, such as oxygen and water, from entering the substrate during heat treatment, so that damage to the substrate cannot be completely eliminated, but is minimized to a sufficient degree.

FIG. 1 is used to explain the structure of an NV center. FIG. 1 shows a section of the crystal lattice of diamond. The diamond structure is characterized by an fcc lattice with a diatomic base. The undisturbed single-crystal diamond lattice consists exclusively of sp3-hybridized carbon. Each carbon atom C is thus bonded to four nearest neighbors.

An NV center is formed by a nitrogen atom occupying a lattice site of a carbon atom. In FIG. 1, the nitrogen atom is labeled N.

Adjacent to the nitrogen atom, there is a vacant site or vacancy V. The nearest neighbors of the vacancy V are thus three carbon atoms C and one nitrogen atom N. The defect of the crystal lattice by a vacancy and a neighboring nitrogen atom gives the NV center its name. Five electrons are thus assigned to the vacancy V, namely three bonding electrons of the neighboring carbon atoms and two electrons of the nitrogen atom. In addition, an NV center can be negatively charged, so that six electrons are assigned to the NV$^-$ center.

The two unbound electrons of the negatively charged NV$^-$ center form a triplet state. This state consists of a state with ms=0 and a twofold degenerate state with ms=±1. The term scheme of this triplet is shown in FIG. 2.

As shown in FIG. 2, the states ms=±1 are energetically degenerate, i.e. both states have the same energy. The states ms=±1, on the one hand, and ms=0, on the other hand, are energetically separated by an energy gap of 12 peV. Transitions between the two states can thus be excited by microwave radiation with a frequency of about 2.88 GHz.

As further shown in FIG. 2, the degeneracy is eliminated when the NV center is subjected to a magnetic field. Parallel and antiparallel alignments of the spin to the external magnetic field are separated from one another by the energy QE. The magnitude QE is proportional to the magnetic field. Thus, the magnetic field can be determined from the measurement of the energetic splitting. In order to carry out the measurement, NV centers in the substrate are excited by, for example, green light at 532 nm. These excited states decay either directly by emitting red fluorescent light having a wavelength of about 637 to about 800 nm. Alternatively, excited states can also decay into the basic state via the intermediate states 1A1 1 E. the two excited intermediate states are separated by a wavelength of 1042 nm so that the detection of infrared light having a wavelength of 1042 nm can also be used for the magnetic field measurement.

The sensitivity of the magnetic field measurement increases when the substrate comprises the largest possible number of NV centers. At the same time, however, detection of the fluorescent light becomes impossible or at least more difficult if there is a plurality of defects in the diamond lattice of the substrate, which in turn absorb the fluorescent light again. The method according to an embodiment is suitable and intended to generate NV centers in the diamond and at the same time to reduce the absorption in the wavelength range of the fluorescent light.

FIG. 3 shows a flow chart of the method proposed according to an embodiment. In the first method step 51, a substrate is provided which comprises or consists of diamond. The substrate can comprise natural or artificially produced diamond. Preferably, but not necessarily, the substrate is monocrystalline. In some embodiments of the invention, an artificially produced diamond can be produced using a HPHT process at high pressure and high temperature. In other embodiments of the invention, artificial diamond can be deposited from an activated gas phase by means of low pressure synthesis. A CVD diamond of this type can be produced homoepitaxially on a diamond substrate or heteroepitaxially on a foreign substrate.

In addition, the substrate used according to an embodiment comprises, at least in individual partial areas or partial volumes, nitrogen which is at least partially incorporated on lattice sites of the diamond. The nitrogen can be introduced into the diamond during the production of the diamond by means of high-pressure or low-pressure synthesis or can be naturally present in the diamond. According to an embodiment, the nitrogen content is more than about 1 ppm or more than about 5 ppm or more than about 10 ppm or more than about 50 ppm. However, in some embodiments of the invention, the nitrogen content is less than about 300 ppm or less than about 200 ppm or less than about 100 ppm.

In a second method step 52, the substrate is subjected to a first heat treatment at a temperature of about 1500° C. to about 2500° C. In some embodiments, the heat treatment may last for more than one hour and less than 48 hours. The general rule is here that the higher the selected temperature, the shorter the duration of the heat treatment, and vice versa. An increasingly higher temperature leads more easily to an oxidation of the diamond but can be compensated for by a lower partial pressure of the oxygen. When the partial pressure is very low, short treatments at higher temperatures above 2500° C. are also possible.

In order to avoid the destruction of the diamond, the first heat treatment in the second method step 52 is preferably carried out at an oxygen partial pressure of less than about 0.21 mPa. This can be done, for example, in a vacuum. In other embodiments of the invention, an inert gas atmosphere can be used.

In some embodiments of the invention, the first heat treatment can alternatively or additionally be carried out at a high pressure of about 0.5 GPa to about 10 GPa, such that the conditions during the first heat treatment are comparable to the conditions to which a diamond crystal is subjected during the HPHT synthesis.

In an optional third method step 53, crystal damage to the surface of the substrate is removed. For this purpose, in some embodiments of the invention, mechanical polishing and/or wet or dry chemical etching of at least one surface of the substrate can be carried out. This can remove graphitic phases or other damage to the crystal lattice that may be produced in the preceding second method step 52 and that increase the absorption and/or scattering of fluorescent light emanating from the color centers. However, after polishing and/or etching, it is possible to obtain a substantially defect-free substrate again.

In some embodiments of the invention, dry chemical etching of the substrate can be carried out by means of a hydrogen plasma. In some embodiments of the invention, wet chemical etching of at least one surface of the substrate can be performed using nitrating acid, i.e. a mixture of concentrated nitric acid and concentrated sulfuric acid with different mixing ratios. Both etchants attack damaged diamond and graphitic phases at a greater etch rate than crystalline diamond, thus avoiding excessive removal of material from the substrate.

It should be noted, however, that the third method step 53 is optional and may also be omitted in some embodiments of the invention.

In a fourth method step 54, at least a partial area of the substrate is irradiated with radiation which generates vacancies in the diamond. In some embodiments of the invention, the radiation used for this purpose can be a particle radiation, for example an electron radiation and/or a proton radiation and/or a heavy ion radiation and/or a neutron radiation. It is essential that the radiation creates vacancies in the crystal lattice of the diamond, i.e. removes individual carbon atoms from the crystal lattice from their lattice sites.

After carrying out the irradiation, a second heat treatment is carried out, according to an embodiment, in the fifth method step 55, which treatment is performed at lower temperatures than the first heat treatment. For example, the second heat treatment can be carried out at a temperature of about 700° C. to about 1500° C. The duration of the second heat treatment can last from about 0.5 hours to about 5 hours. The second heat treatment can also be performed in a vacuum or in an inert gas atmosphere to prevent damage to the diamond or oxidation of its surface. However, due to the lower temperatures, the requirements for this may be reduced compared to the first heat treatment.

In an optional sixth method step 56, crystal damage to the surface of the substrate can be removed again or for the first time. In some embodiments of the invention, mechanical polishing and/or wet or dry chemical etching of at least one surface of the substrate can be carried out for this purpose. The parameters and methods used for this purpose may be chosen to be identical to those used in the above described third method step 53.

However, it should be noted that the sixth method step 56 is also optional and can also be omitted in some embodiments of the invention.

According to an embodiment, it has been discovered that by the first heat treatment in combination with subsequent irradiation and second heat treatment, the density of unwanted absorbing defects in the diamond crystal of the substrate is reduced, so that the fluorescent light emanating from the color centers is absorbed to a lesser extent. This can increase the sensitivity and/or the accuracy of a magnetometer based on color centers or the spin coherence time of a qubit. In the following, this effect of the method according to an embodiment will be explained by means of comparative examples.

Figure 4:
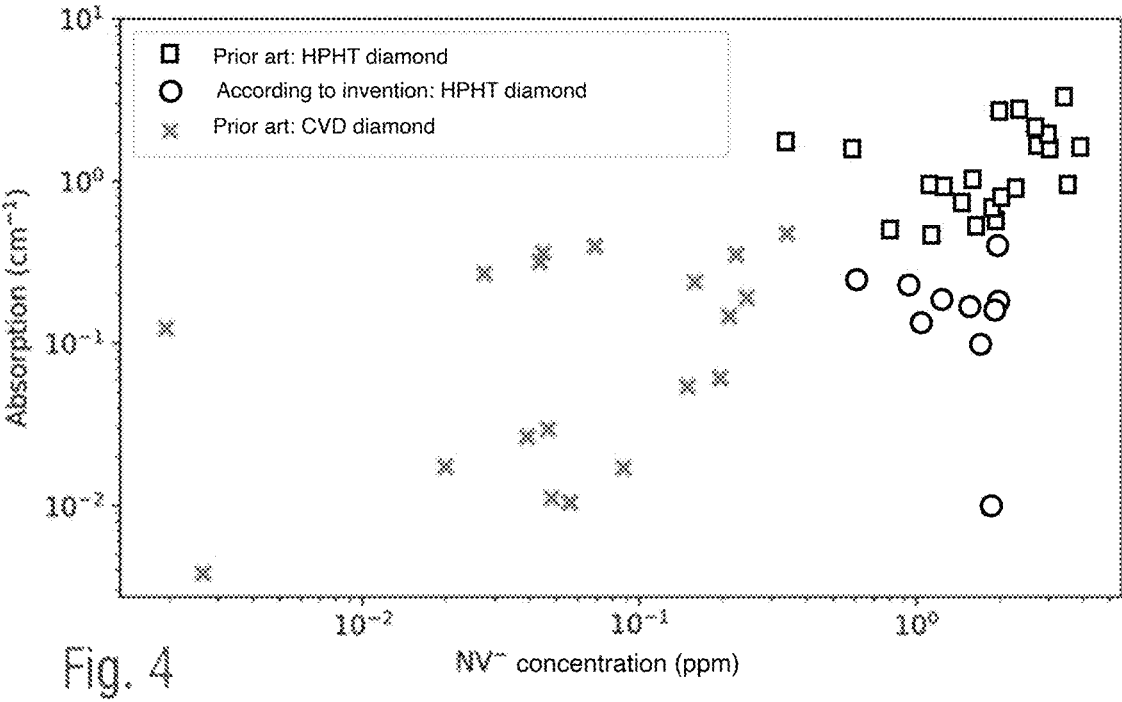
FIG. 4 illustrates the absorption of a substrate on the ordinate versus the concentration of NV centers of this substrate on the abscissa for various known substrates and for substrates produced according to an embodiment.

FIG. 4 shows the absorption in the diamond lattice on the ordinate and the $NV^-$ concentration on the abscissa for a plurality of substrates, which were partially produced according to the method of the invention and partially according to known methods. An improved sensitivity of a magnetic field sensor based on the substrate according to an embodiment is obtained, if the substrate used has a low absorption and high $NV^-$ concentration, i.e. is located in the lower right part of the diagram.

FIG. 4 shows the measured values for 19 known substrates comprising CVD diamond, 19 measured values of known substrates comprising HPHT diamond, and ten measured values of substrates produced according to an embodiment, which also comprise HPHT diamond. As can be seen from FIG. 4, the substrates produced according to an embodiment show a comparable $NV^-$ concentration with regard to the best substrates known to date when the absorption is reduced at the same time. The absorption can in this case be reduced by more than a factor of 20 or more than a factor of 10 or more than a factor of 5. Due to this, the fluorescence signal can be detected with higher sensitivity and/or higher reliability so that the detection of a magnetic field is improved.

Figure 5:
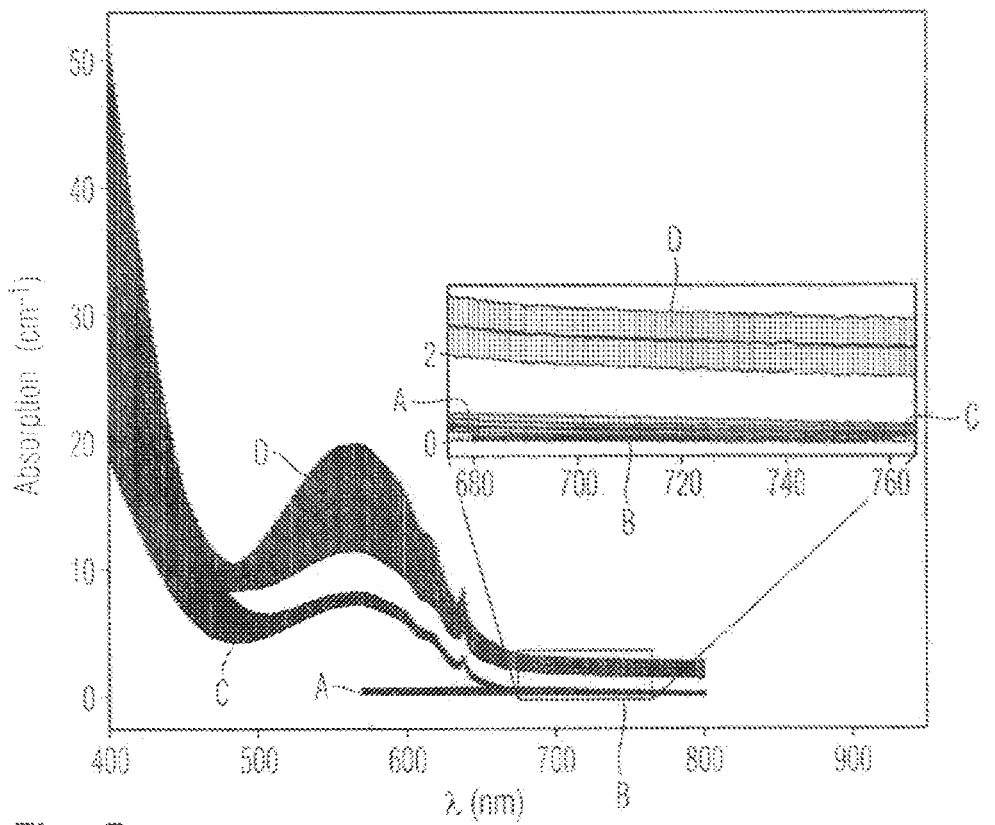
FIG. 5 illustrates the absorption on the ordinate and the wavelength in the visible spectral range on the abscissa for a plurality of known substrates and substrates according to an embodiment.
Figure 6:
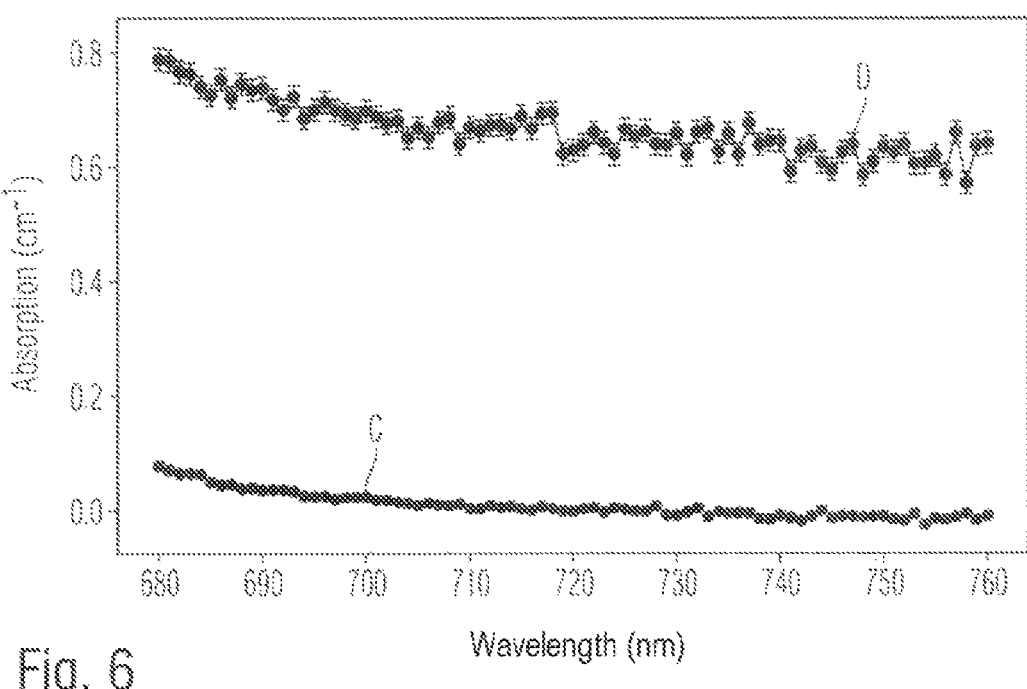
FIG. 6 illustrates the absorption on the ordinate and the wavelength in the visible spectral range on the abscissa for a known substrate and a substrate produced according to an embodiment.
Figure 7:
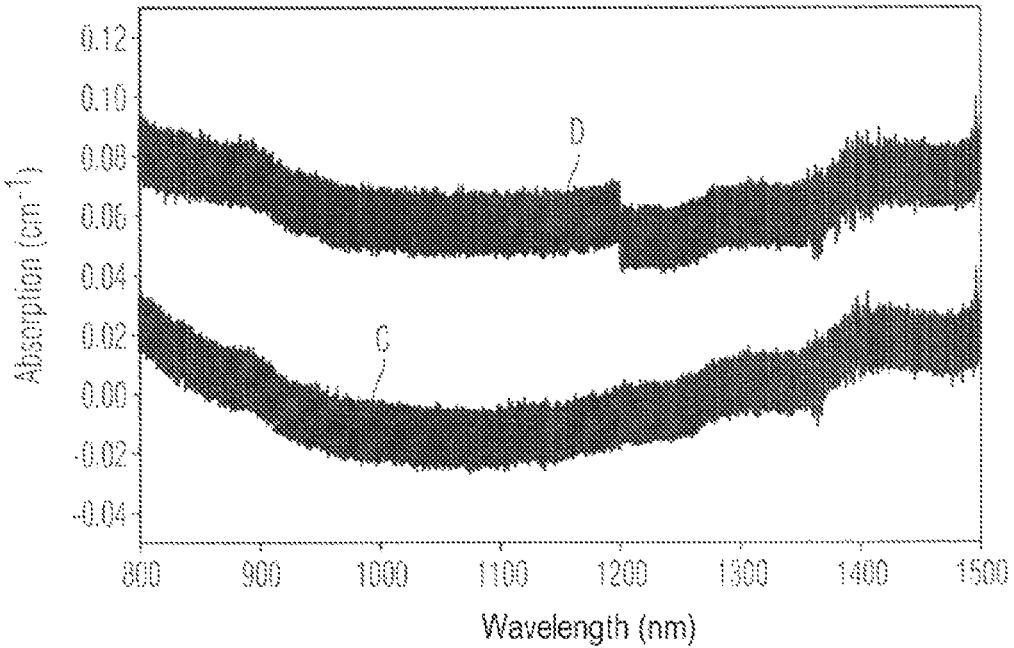
FIG. 7 illustrates the absorption on the ordinate and the wavelength in the infrared spectral range on the abscissa for a known substrate and a substrate made according to an embodiment.

With reference to FIGS. 5, 6 and 7, the absorption is explained in more detail on the basis of the wavelength. In this context, known substrates having NV centers are compared with substrates having NV centers produced according to an embodiment. Furthermore, FIG. 5 shows the absorption of a substrate according to an embodiment during the production after different production steps. FIGS. 5 and 6 show the visible spectral range from 680 to 760 nm. FIG. 7 shows the adjacent infrared spectral range from 800 nm to 1500 nm.

FIG. 5 shows measured values of absorption versus wavelength for four different substrates, namely in curve A the absorption of untreated, nitrogen-comprising diamond substrates, which are used as a starting material for both the method according to an embodiment and known manufacturing methods. Curve B shows the absorption versus the wavelength for diamond substrates after the first heat treatment at 1800° C. in a vacuum of 1.10-5 mbar. Curve C shows the absorption of substrates produced according to an embodiment after the following method steps: first heat treatment at 1800° C., irradiation with protons to generate vacancies, and second heat treatment at about 1000° C. Finally, curve D shows the results of comparative tests. For this purpose, diamond substrates comprising nitrogen were irradiated and subsequently subjected to the second heat treatment. A first heat treatment carried out prior to the irradiation did not take place.

FIG. 5 here shows the averaging over several samples. FIG. 6 shows measured values for one sample each, namely the best substrate produced according to an embodiment and the best substrate produced according to the known method in the visible spectral range. FIG. 7 again shows the averaging over several samples in the wavelength range 800 nm-1500 nm.

As shown in FIG. 5, the absorption of the starting material changes only slightly as a result of the first heat treatment. Curves A and B almost lie on top of each other. The material behaves differently after the introduction of NV centers by irradiation and second heat treatment. As shown by curves C and D, the substrates produced according to an embodiment exhibit much lower absorption in the relevant spectral range. In both the visible range and the infrared spectral range, the absorption is lower by a factor of 4 on average. FIG. 6 compares the best samples in each case. In this case, the absorption is even lower by a factor of 8. It should be noted that FIG. 5 lists all the samples produced in each case. No selection was made according to the values achieved. This shows that the method according to an embodiment is robust and deterministic in reaching the low absorbance. The method according to an embodiment is reproducible for each sample.

Figure 8:
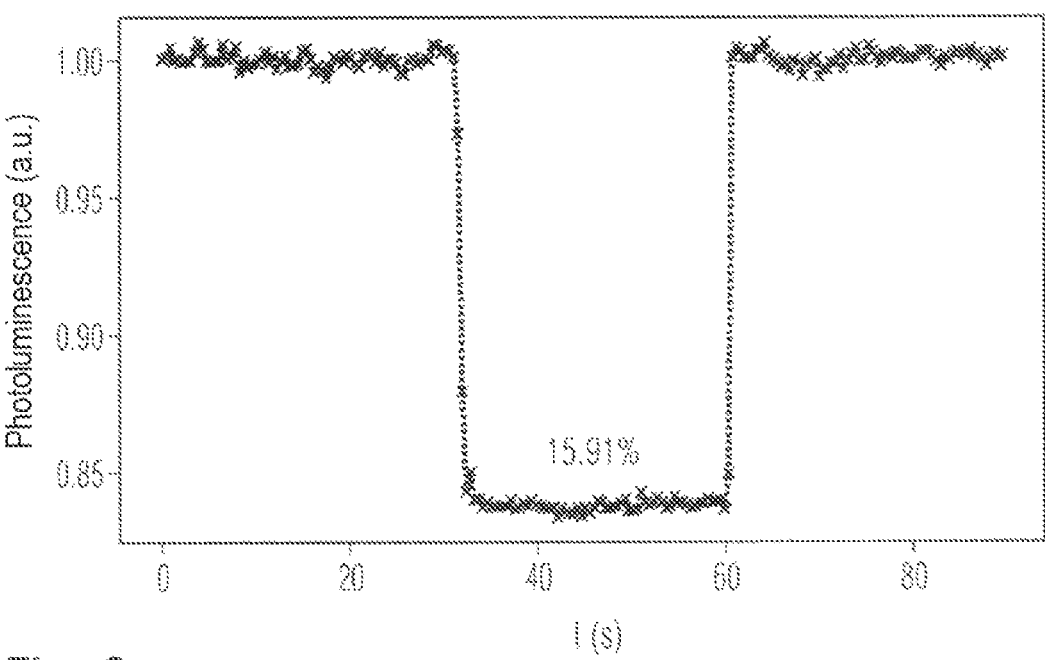
FIG. 8 illustrates the results of a contrast measurement on a substrate according to an embodiment.

FIG. 8 shows a contrast measurement of a substrate produced according to an embodiment. The photoluminescence is detected during the irradiation with a laser having a wavelength of 532 nm on the ordinate versus the time on the abscissa. After 30 seconds, a permanent magnet having a field strength of 180 mT is brought into close proximity to the substrate. The distance between the permanent magnet and the substrate is about 2 mm. At the time t=60s, the permanent magnet is removed again.

The contrast of the photoluminescence signal is the relative difference of the photoluminescence with and without magnetic field. It is about 16% in the illustrated example. This contrast is high and is achieved by the production according to an embodiment. Typically, ensemble ODMR contrasts of known substrates are below 5%.

Figure 9:
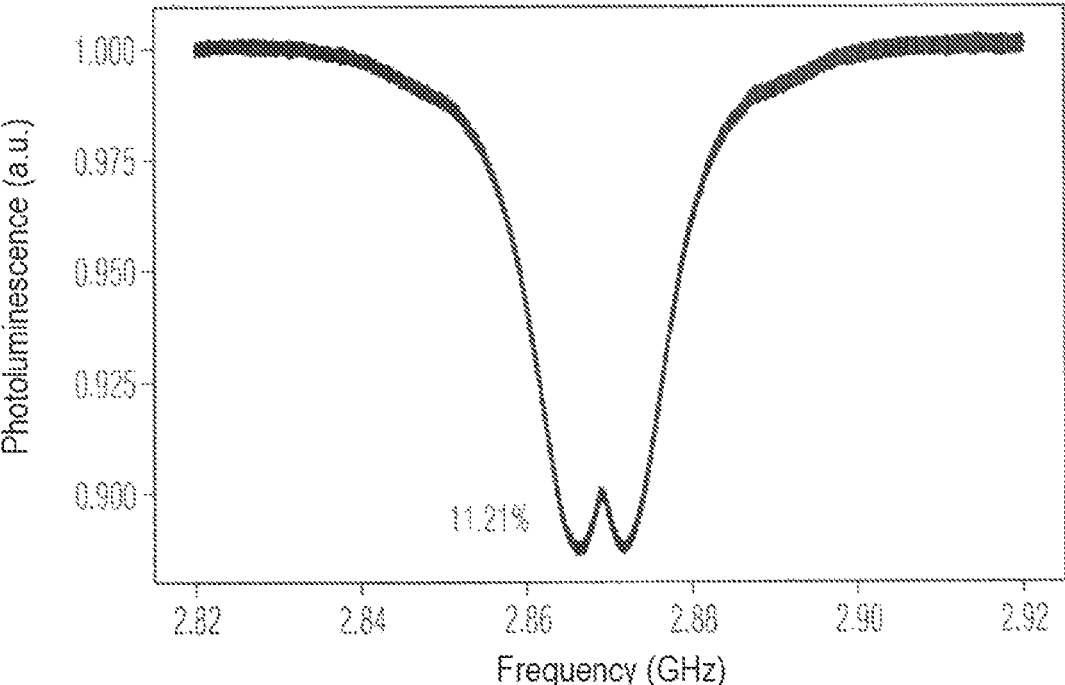
FIG. 9 illustrates a measurement of optically detected magnetic resonance on a substrate produced according to an embodiment.

FIG. 9 shows a measurement of optically detected magnetic resonance on a substrate produced according to an embodiment. The photoluminescence is shown during irradiation with a laser at a wavelength of 532 nm on the ordinate versus the frequency of a microwave radiation simultaneously acting on the substrate on the abscissa. The microwave radiation was emitted through a single loop antenna, resulting in an inhomogeneous microwave field across the volume of the substrate.

As can be seen from FIG. 9, the ensemble contrast is 11.2%. It can be assumed that the contrast can be further improved if a homogeneous excitation with microwaves is carried out. Nevertheless, it should be noted that the measured ensemble contrast is higher than the values for known substrates, which is not more than 5% even in the best case.

NV centers can also be used as sensors for magnitudes other than the magnetic field, such as the electric field, pressure or temperature. The invention provides analogous advantages of better sensitivity for such a use as well.

Figure 10:
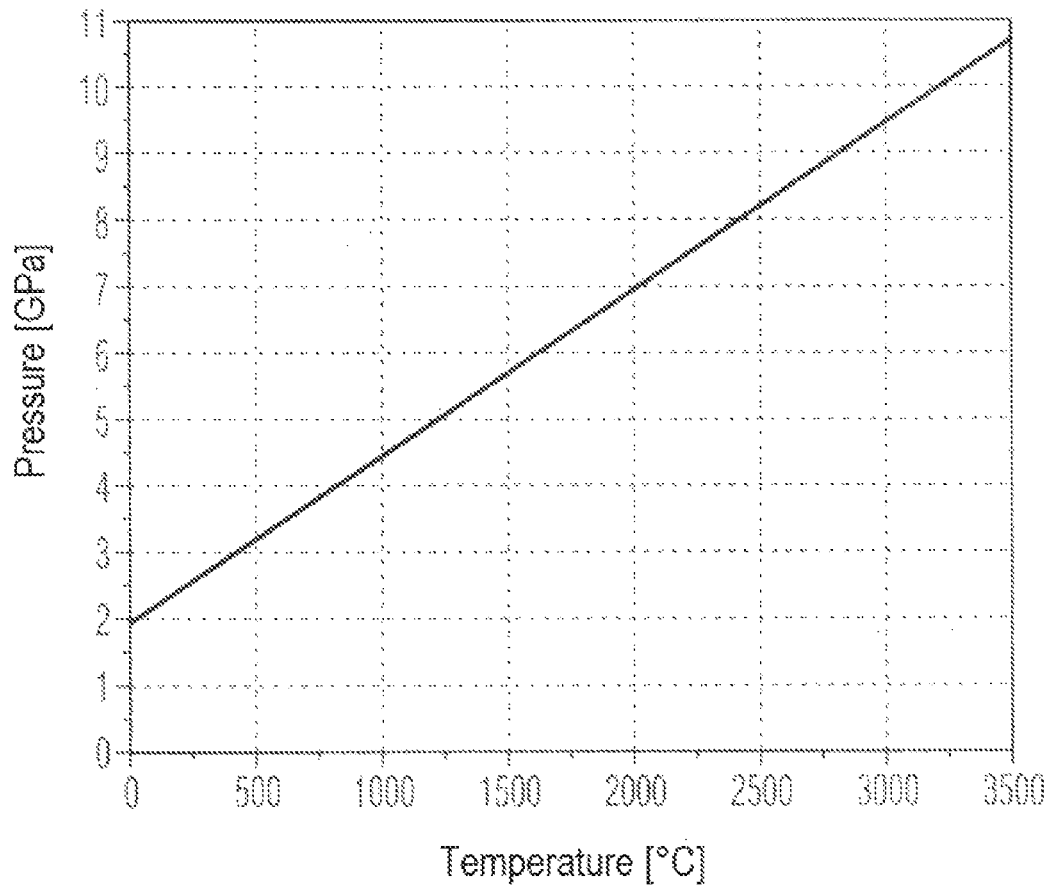
FIG. 10 illustrates the Simon-Berman line.

In some embodiments of the invention, the first heat treatment can be carried out at a pressure and temperature that are above the Simon-Berman line. In this case, the Simon-Berman line represents the phase coexistence of graphite and diamond. It is shown in FIG. 10.

The pressure in GPa is plotted on the ordinate and the temperature in ° C. on the abscissa. In some embodiments of the invention, the pressure and temperature of the first heat treatment are selected in such a way that the conditions are above the Simon-Berman line in order to avoid excessive damage to the substrate during the first heat treatment.

Of course, the invention is not limited to the illustrated embodiments. Therefore, the above description should not be considered limiting but explanatory. The below claims should be understood in such a way that a described feature is available in at least one exemplary embodiment. This does not rule out the presence of further features. If the claims and the above description define "first" and "second" embodiments, this designation serves to distinguish between two similar embodiments without determining an order.

It is noted that various individual features of the inventive processes and systems may be described only in one exemplary embodiment herein. The particular choice for description herein with regard to a single exemplary embodiment is not to be taken as a limitation that the particular feature is only applicable to the embodiment in which it is described. All features described herein are equally applicable to, additive, or interchangeable with any or all of the other exemplary embodiments described herein and in any combination or grouping or arrangement. In particular, use of a single reference numeral herein to illustrate, define, or describe a particular feature does not mean that the feature may not be associated or equated to another feature in another drawing figure or description. Further, where two or more reference numerals are used in the figures or in the drawings, this should not be construed as being limited to only those embodiments or features, they are equally applicable to similar features or not a reference numeral is used or another reference numeral is omitted.

The foregoing description and accompanying drawings illustrate the principles, exemplary embodiments, and modes of operation of the systems, apparatuses, and methods. However, the systems, apparatuses, and methods should not be construed as being limited to the particular embodiments discussed above. Additional variations of the embodiments discussed above will be appreciated by those skilled in the art and the above-described embodiments should be regarded as illustrative rather than restrictive. Accordingly, it should be appreciated that variations to those embodiments may be made by those skilled in the art without departing from the scope of the systems, apparatuses, and methods as defined by the following claims.

What is claimed is:

1. A substrate comprising:
   diamond, wherein the diamond comprises NV$^-$ color centers in a concentration of more than 0.5 parts per million (ppm), further wherein the diamond has an absorption coefficient of electromagnetic radiation in a wavelength range from 680 nanometers (nm) to 760 nm of less than 0.4 per centimeter (cm$^{-1}$).

2. The substrate according to claim 1, wherein the diamond has an absorption coefficient of electromagnetic radiation in the wavelength range from 680 nm to 760 nm of less than 0.2 cm$^{-1}$.

3. The substrate according to claim 1, wherein the diamond of the substrate has an absorption coefficient of electromagnetic radiation in the wavelength range from 680 nm to 760 nm of more an 0.001 cm$^{-1}$.

4. The substrate according to claim 1, wherein the diamond comprises NV$^-$ color centers in a concentration greater than 1 ppm.

5. The substrate according to claim 2, wherein the diamond of the substrate has an absorption coefficient of electromagnetic radiation in a wavelength range from 1000 nm to 1100 nm of less than 0.04 cm$^{-1}$ or less than 0.02 cm$^{-1}$ or less than 0.01 cm$^{-1}$.

6. The substrate according to claim 1, wherein the diamond comprises NV$^-$ color centers in a concentration of less than 10.0 ppm.

7. The substrate according to claim 1, wherein the NV$^-$ color centers exhibit an ensemble contrast, as determined by optically detected magnetic resonance, of more than 6%.

8. A substrate comprising:
   diamond, wherein the diamond comprises NV$^-$ color centers in a concentration of more than 0.5 parts per million (ppm) and less than 10.0 ppm, wherein the diamond has an absorption coefficient of electromagnetic radiation in a wavelength range from 680 nanometers (nm) to 760 nm of less than 0.4 per centimeter (cm$^{-1}$).

9. A substrate comprising:
   diamond, wherein the diamond comprises NV$^-$ color centers in a concentration of more than 0.5 parts per million (ppm) and less than 10.0 ppm, further wherein the diamond has an absorption coefficient of electromagnetic radiation in a wavelength range from 680 nanometers (nm) to 760 nm of less than 0.4 per centimeter (cm$^{-1}$) and more than 0.001 cm$^{-1}$.

* * * * *